(12) United States Patent
Endou et al.

(10) Patent No.: US 8,067,148 B2
(45) Date of Patent: Nov. 29, 2011

(54) PATTERN FORMING METHOD

(75) Inventors: Masayuki Endou, Toyama (JP); Masaru Sasago, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/780,597

(22) Filed: May 14, 2010

(65) Prior Publication Data
US 2010/0221672 A1 Sep. 2, 2010

Related U.S. Application Data

(63) Continuation of application No. PCT/JP2009/005348, filed on Oct. 14, 2009.

(30) Foreign Application Priority Data

Feb. 27, 2009 (JP) ................................. 2009-045616

(51) Int. Cl.
*G03F 7/26* (2006.01)
(52) U.S. Cl. ............................ 430/325; 430/322; 430/330
(58) Field of Classification Search ................... 430/311, 430/322, 330, 331, 313, 324
See application file for complete search history.

(56) References Cited

U.S. PATENT DOCUMENTS

| 6,180,320 B1 | 1/2001 | Saito et al. |
| 2005/0069813 A1 | 3/2005 | Sawada et al. |

FOREIGN PATENT DOCUMENTS

| JP | 2000-035672 | 2/2000 |
| JP | 2002-006512 | 1/2002 |
| JP | 2002-299202 | 10/2002 |
| JP | 2005-107116 | 4/2005 |
| JP | 2007-017993 | 1/2007 |

*Primary Examiner* — Kathleen Duda
(74) *Attorney, Agent, or Firm* — McDermott Will & Emery LLP

(57) ABSTRACT

A resist film of a positive type containing a photoacid generator is formed on a substrate. Then, pattern exposure is performed by selectively irradiating the resist film with exposure light. Thereafter, first heating is performed on the resist film subjected to the pattern exposure. After the heating, first development is performed on the resist film, thereby forming a first resist pattern. Subsequently, the first resist pattern is exposed to a solution containing a thermal acid generator and containing neither polymer nor a cross-linking agent. After the exposure, second heating is performed on the first resist pattern. Second development is then performed on the first resist pattern, thereby forming a second resist pattern made of the first resist pattern having a reduced size.

15 Claims, 10 Drawing Sheets

PATTERN FORMING METHOD

CROSS-REFERENCE TO RELATED APPLICATION

This is a continuation of PCT International Application PCT/JP2009/005348 filed on Oct. 14, 2009, which claims priority to Japanese Patent Application No. 2009-045616 filed on Feb. 27, 2009. The disclosures of these applications including the specifications, the drawings, and the claims are hereby incorporated by reference in their entirety.

BACKGROUND

The present invention relates to pattern forming methods for use in, for example, processes for fabricating semiconductor devices With increasing integration of semiconductor integrated circuits and downsizing of semiconductor elements, there has been a demand for acceleration of the development of lithography techniques. At present, pattern formation is performed by photolithography using mercury lamps, KrF excimer lasers, ArF excimer lasers, or the like, as sources of exposure light. In addition, resolution is increased by employing immersion lithography. Further, the use of extreme ultraviolet light having a shorter wavelength as exposure light is also studied.

In this manner, various techniques are studied for pattern miniaturization. Among these techniques, a technique for obtaining a finer pattern by trimming an already formed resist pattern through etching has been recently proposed.

A conventional pattern forming method for obtaining a fine pattern with a trimming technique through etching will be described with reference to FIGS. 9A-9D, 10A, and 10B.

First, a chemically amplified positive resist material having the following composition is prepared.

Base polymer: poly(2-methyl-2-adamanthyl methacrylate (50 mol %)—γ-butyrolactone methacrylate (40 mol %)—2-hydroxy adamantane methacrylate (10 mol %)) . . . 2 g Photoacid generator: triphenylsulfonium trifluoromethanesulfonic acid . . . 0.05 g Quencher: triethanolamine . . . 0.002 g Solvent: propylene glycol monomethyl ether acetate . . . 20 g Next, as shown in FIG. 9A, the chemically amplified resist material is applied on a substrate 1, and then is heated at a temperature of 90° C. for 60 seconds, thereby forming a resist film 2 with a thickness of 120 nm.

Then, as shown in FIG. 9B, the resist film 2 is irradiated with exposure light which is ArF excimer laser light having a numerical aperture (NA) of 0.93 through a mask 3, thereby performing pattern exposure.

After the pattern exposure, as shown in FIG. 9C, the resist film 2 is heated with a hot plate at a temperature of 110° C. for 60 seconds.

Thereafter, as shown in FIG. 9D, the resist film 2 is developed with a 2.38 wt % tetramethylammonium hydroxide developer, thereby obtaining a first resist pattern 2a made of an unexposed portion of the resist film 2 and having a line width of 60 nm.

Subsequently, as shown in FIG. 10A, the first resist pattern 2a is ashed with an oxygen-based etching gas. Consequently, as shown in FIG. 10B, upper portions and side portions of the first resist pattern 2a are trimmed, thereby obtaining a second resist pattern 2b having a reduced (shrunk) line width of 50 nm.

SUMMARY

The conventional pattern forming method employing a trimming technique, however, has a problem in which upper portions of the resultant second resist pattern 2b are rounded, resulting in a defective pattern showing so-called edge-rounding. Further, the conventional pattern forming method also has a problem of necessity of additional etching apparatus.

In this manner, etching on a target film using the second resist pattern 2b with a defective pattern causes the pattern obtained from the target film to be defective, thereby reducing productivity and the yield in processes of fabricating semiconductor devices.

It is therefore an object of the present invention to easily implement a pattern forming method for forming a desired pattern shape with a trimming technique.

To easily implement a pattern forming method for forming a desired pattern shape with a trimming technique, the inventors of the present invention conducted various studies, to obtain the following findings. Specifically, a pattern with a desired shape can be easily obtained by exposing an initially formed resist pattern to a solution containing a thermal acid generator, and then heating and developing the resultant resist pattern. The thermal acid generator generates acid through heating after exposure to the solution containing this thermal acid generator, and causes acid elimination in the surface of the resist film forming the pattern. Accordingly, the surface of the pattern is dissolved by subsequent development, thus trimming the pattern. With this method, the pattern surface is uniformly dissolved, and thus, the pattern shape does not deteriorate. In addition, since the amount of trimming is determined only by the amount of the added thermal acid generator and conditions of heating, the method has high controllability of the line width of the pattern to be trimmed. In a process in which a resist pattern is directly exposed to an acid solution, acid might volatilize through heating before reaction between acid and the resist pattern, and thus, it is difficult to control the line width.

Japanese Patent Publication No. 2007-017993 shows a method using a heat generator, as a method for shrinking of a resist pattern. In the method of Japanese Patent Publication No. 2007-017993, a film made of polymer and a cross-linking agent are mixed with a resist pattern so that a portion which has become alkali-soluble due to the mixing is removed by development. The present invention differs from Japanese Patent Publication No. 2007-017993 in that the resist pattern is only exposed to a thermal acid generator and materials different from those used in Japanese Patent Publication No. 2007-017993 are used. In addition, in the present invention, no films are formed on the surface of the resist pattern. Further, with respect to principles in shrinking of the pattern, the technique of the present invention employs acid elimination of the resist, and thus, differs from the technique of Japanese Patent Publication No. 2007-017993 in this regard. Moreover, in Japanese Patent Publication No. 2007-017993, since a film is formed on the surface of the resist pattern, the film thickness might be uneven in portions having sparse or dense patterns during formation of the film. Accordingly, the amount of shrinkage of the pattern greatly depends on the degree of sparseness and denseness.

In contrast, in the present invention, the process of exposing the resist pattern to the solution enables the thermal acid generator to be uniformly attached to the surface of the resist pattern, and thus, the process can be uniformly performed on portions having sparse and dense patterns. Accordingly, the amount of shrinkage of the pattern hardly depends on the degree of sparseness and denseness.

Based on the foregoing findings, the present invention has been achieved in the following manner.

A pattern forming method according to the present invention includes the steps of: forming, on a substrate, a resist film of a positive type containing a photoacid generator; performing pattern exposure by selectively irradiating the resist film with exposure light; performing first heating on the resist film subjected to the pattern exposure; performing first development on the resist film after the heating, thereby forming a first resist pattern out of the resist film; exposing the first resist pattern to a solution containing a thermal acid generator and containing neither polymer nor a cross-linking agent; performing second heating on the first resist pattern after the exposure to the solution; and performing second development on the first resist pattern after the heating, thereby forming a second resist pattern made of the first resist pattern having a reduced size.

In this pattern forming method, a first resist pattern is formed out of a resist film, and is exposed to a solution containing a thermal acid generator and containing neither polymer nor a cross-linking agent. Thereafter, second heating is performed on the first resist pattern, and then second development is performed on the first resist pattern, thereby forming a second resist pattern made of the first resist pattern having a reduced size. In this manner, acid from the thermal acid generator causes the surface of the first resist pattern to be uniformly dissolved, thereby easily obtaining a desired pattern shape.

In the pattern forming method, the exposure light may be one of KrF excimer laser light, ArF excimer laser light, extreme ultraviolet light, and electron beams.

In the pattern forming method, the step of performing the pattern exposure may be performed with a liquid provided on the resist film. Then, a finer pattern can be obtained.

In this case, the liquid may be water.

In the case of immersion lithography using a liquid for pattern exposure, the exposure light may be one of KrF excimer laser light and ArF excimer laser light.

In the pattern forming method, the thermal acid generator is preferably decomposed by the second heating.

In the pattern forming method, the photoacid generator is preferably decomposed at a temperature higher than a temperature of the second heating. Then, the photoacid generator is not decomposed by heat during the second heating. If the photoacid generator was decomposed by heat during the second heating, acid elimination would occur in the entire first resist pattern to increase the degree of dissolving in subsequent second development, resulting in excessive trimming or dissolving of the entire pattern. However, if the photoacid generator is decomposed at a temperature higher than that of the second heating, such problems do not occur. The temperature of the second heating differs among thermal acid generators to be used, and is in the range from about 90° C. to about 120° C., both inclusive, in most cases. However, the present invention is not limited to this temperature range.

In the pattern forming method, the photoacid generator may be at least one of triphenylsulfonium trifluoromethanesulfonic acid, triphenylsulfonium nonafluorobutanesulfonic acid, diphenyliodonium trifluoromethanesulfonic acid, and diphenyliodonium nonafluorobutanesulfonic acid.

In the pattern forming method, the thermal acid generator may be one of toluenesulfonic acid cyclohexyl and toluenesulfonic acid—(2-isopropyl-5-methyl-cyclohexyl).

In the pattern forming method, the step of exposing the first resist pattern to the solution may be performed with one of a puddle method, a dipping method, and a spray method.

A solvent in which the thermal acid generator is to be dissolved is preferably a solvent in which the resist pattern is not dissolved. For example, an alcohol-based solvent may be used. Examples of alcohol-based solvents include, but not limited to, n-propyl alcohol, isopropyl alcohol, n-butyl alcohol, isobutyl alcohol, sec-butyl alcohol, tert-butyl alcohol, n-amyl alcohol, isoamyl alcohol, sec-amyl alcohol, and tert-amyl alcohol.

The amount of the thermal acid generator to be added to the solvent and the period during which the resist pattern is exposed to the solution depend on the amount of trimming of the resist pattern, and cannot be set at fixed values. For example, the amount of the thermal acid generator to be added to the solvent may be in the range from about 0.5%, by weight, to about 30%, by weight, both inclusive. The period during which the resist pattern is exposed to the solution may be in the range from about 5 seconds to about 300 seconds, both inclusive. However, the present invention is not limited to these ranges.

According to the present invention, a pattern forming method for forming a desired pattern shape with a trimming technique can be easily implemented.

DETAILED DESCRIPTION

FIRST EMBODIMENT

A pattern forming method according to a first embodiment will be described with reference to FIGS. 1A-1D and 2A-2C.

First, a chemically amplified positive resist material having the following composition is prepared.

Figure 1A:
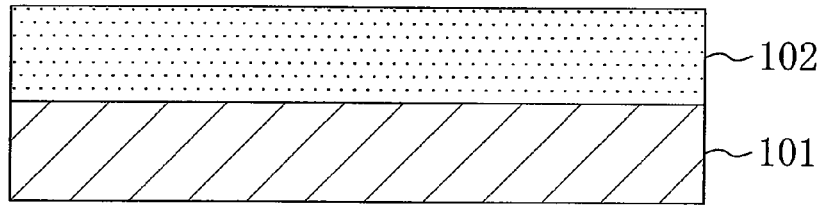
FIGS. 1A-1D are cross-sectional views illustrating process steps of a pattern forming method according to a first embodiment.

Base polymer: poly(2-methyl-2-adamanthyl methacrylate (50 mol %)—γ-butyrolactone methacrylate (40 mol %)—2-hydroxy adamantane methacrylate (10 mol %)) . . . 2 g Photoacid generator: triphenylsulfonium trifluoromethanesulfonic acid . . . 0.05 g Quencher: triethanolamine . . . 0.002 g Solvent: propylene glycol monomethyl ether acetate . . . 20 g Next, as shown in FIG. 1A, the chemically amplified resist material is applied on a substrate 101, and then is heated at a temperature of 90° C. for 60 seconds, thereby forming a resist film 102 with a thickness of 120 nm.

Figure 1B:
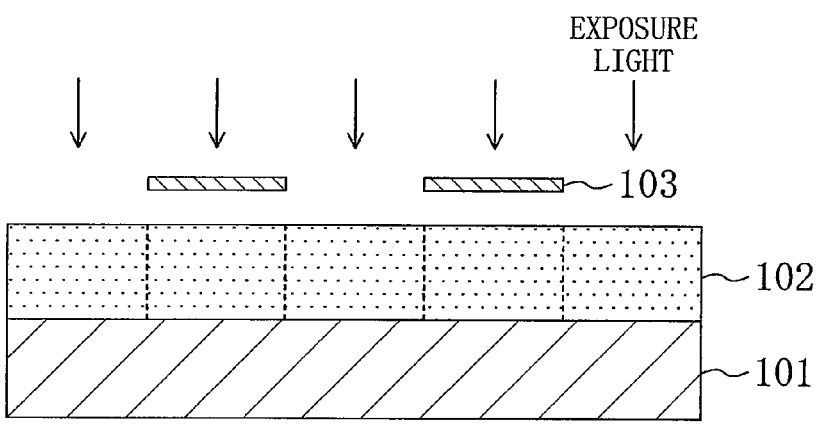

Then, as shown in FIG. 1B, the resist film 102 is irradiated with exposure light which is ArF excimer laser light having a numerical aperture (NA) of 0.93 through a mask 103, thereby performing pattern exposure.

Figure 1C:
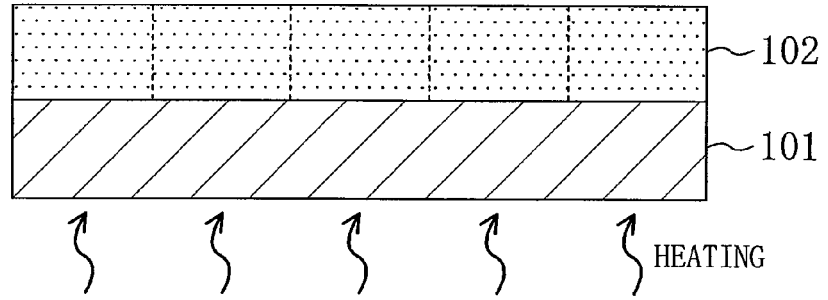

After the pattern exposure, as shown in FIG. 1C, the resist film 102 is heated with a hot plate at a temperature of 110° C. for 60 seconds.

Figure 1D:
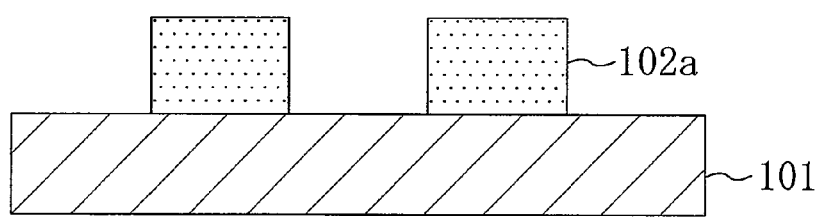

Thereafter, as shown in FIG. 1D, the resist film 102 is developed with a 2.38 wt % tetramethylammonium hydroxide developer, thereby obtaining a first resist pattern 102a made of an unexposed portion of the resist film 102 and having a line width of 60 nm.

Figure 2A:
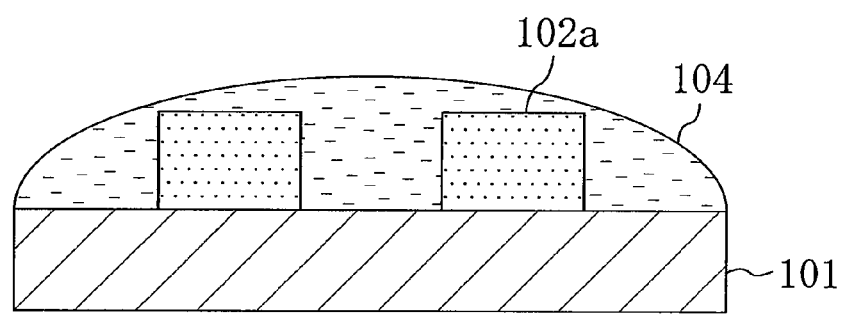
FIGS. 2A-2C are cross-sectional views illustrating process steps of the pattern forming method of the first embodiment.

Subsequently, as shown in FIG. 2A, a solution 104 containing a thermal acid generator having a composition below is dropped onto the substrate 101 with a puddle method to cover the first resist pattern 102a, thereby exposing the first resist pattern 102a to the solution 104 for 30 seconds.

Thermal acid generator: toluenesulfonic acid cyclohexyl . . . 5 g

Solvent: sec-butyl alcohol . . . 25 g

Figure 2B:
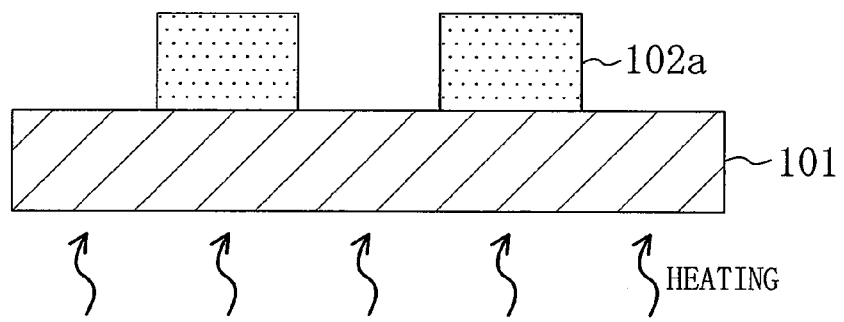

Thereafter, as shown in FIG. 2B, the solution 104 is removed, and then the first resist pattern 102a is heated at a temperature of 95° C. for 60 seconds.

Figure 2C:
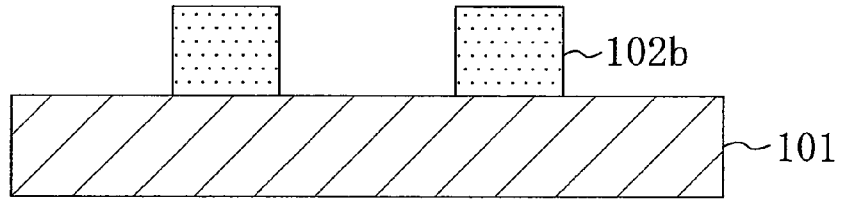

Then, the resultant first resist pattern 102a is developed with a 2.38 wt % tetramethylammonium hydroxide developer, thereby obtaining a second resist pattern 102b trimmed to have a line width of 50 nm and maintaining a desired shape of the first resist pattern 102a, as shown in FIG. 2C.

In this manner, in the first embodiment, the first resist pattern 102a is exposed to the solution 104 containing toluenesulfonic acid cyclohexyl as the thermal acid generator, and then is heated again at a temperature lower than that at post exposure bake. At this time, the thermal acid generator diffused in the surface of the first resist pattern 102a generates acid by heating, and causes acid elimination of acid leaving groups of main polymer (i.e., base polymer) located in the surface of the first resist pattern 102a. Accordingly, a subsequent phenomenon causes the surface of the first resist pattern 102a to be uniformly dissolved, thereby uniformly trimming the pattern. As a result, the second resist pattern 102b has a desired shape.

SECOND EMBODIMENT

A pattern forming method according to a second embodiment will be described hereinafter with reference to FIGS. 3A-3D and 4A-4C.

First, a chemically amplified positive resist material having the following composition is prepared.

Figure 3A:
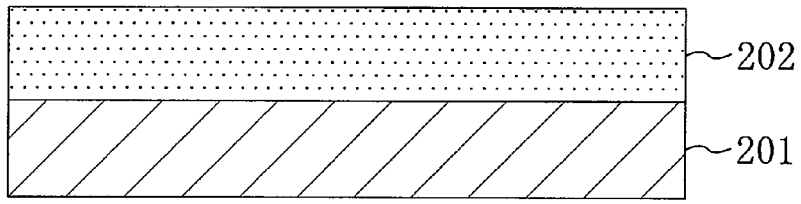
FIGS. 3A-3D are cross-sectional views illustrating process steps of a pattern forming method according to a second embodiment.

Base polymer: poly(2-methyl-2-adamanthyl methacrylate (50 mol %)—γ-butyrolactone methacrylate (40 mol %)—2-hydroxy adamantane methacrylate (10 mol %)) . . . 2 g Photoacid generator: triphenylsulfonium trifluoromethanesulfonic acid . . . 0.05 g Quencher: triethanolamine . . . 0.002 g Solvent: propylene glycol monomethyl ether acetate . . . 20 g Next, as shown in FIG. 3A, the chemically amplified resist material is applied on a substrate 201, and then is heated at a temperature of 90° C. for 60 seconds, thereby forming a resist film 202 with a thickness of 120 nm.

Figure 3B:
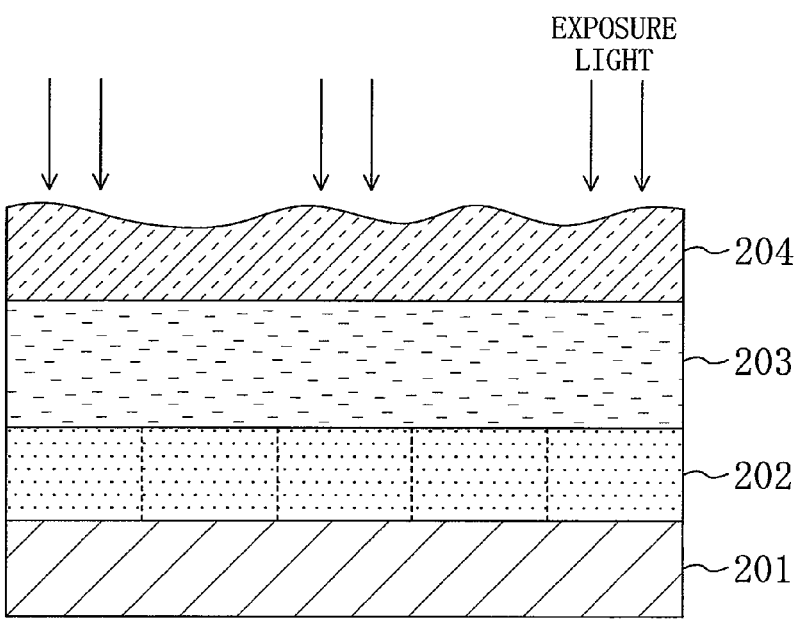

Then, as shown in FIG. 3B, with water 203 for immersion lithography provided between the resist film 202 and a projection lens 204 by, for example, a puddle method, the resist film 202 is irradiated, through the water 203, with exposure light which is ArF excimer laser light having an NA of 1.2 and having passed through a mask (not shown), thereby performing pattern exposure.

Figure 3C:
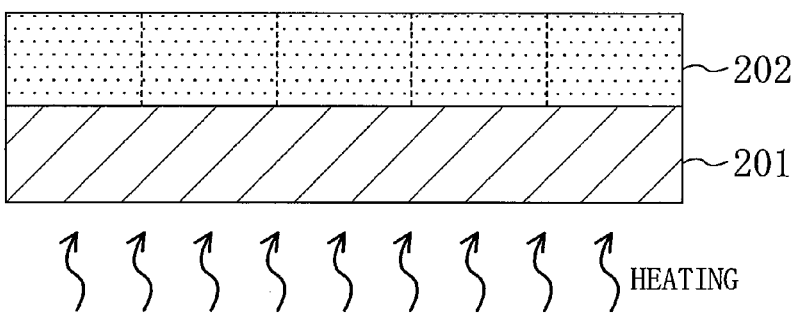

After the pattern exposure, as shown in FIG. 3C, the resist film 202 is heated with a hot plate at a temperature of 110° C. for 60 seconds.

Figure 3D:
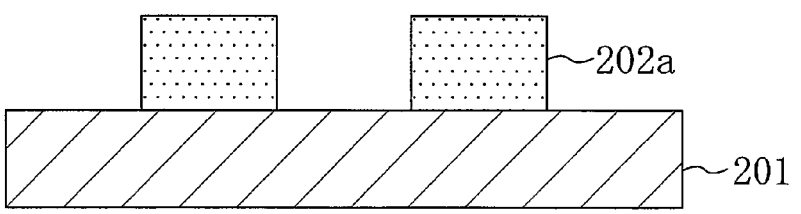

Thereafter, as shown in FIG. 3D, the resist film 202 is developed with a 2.38 wt % tetramethylammonium hydroxide developer, thereby forming a first resist pattern 202a made of an unexposed portion of the resist film 202 and having a line width of 55 nm.

Figure 4A:
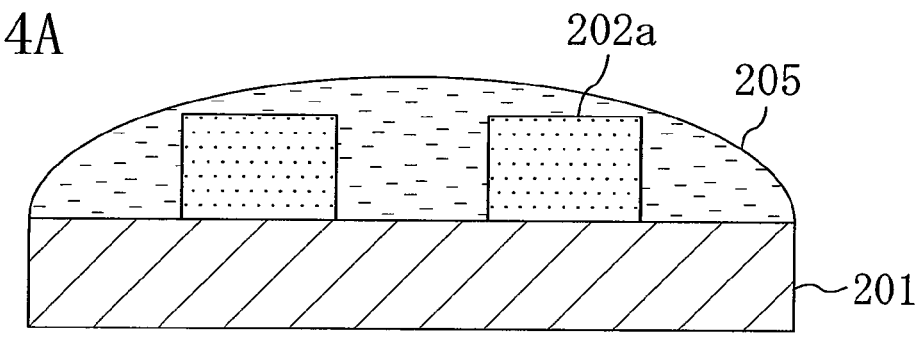
FIGS. 4A-4C are cross-sectional views illustrating process steps of the pattern forming method of the second embodiment.

Subsequently, as shown in FIG. 4A, a solution 205 containing a thermal acid generator having a composition below is dropped onto the substrate 201 with a puddle method to cover the first resist pattern 202a, thereby exposing the first resist pattern 202a to the solution 205 for 90 seconds.

Figure 4B:
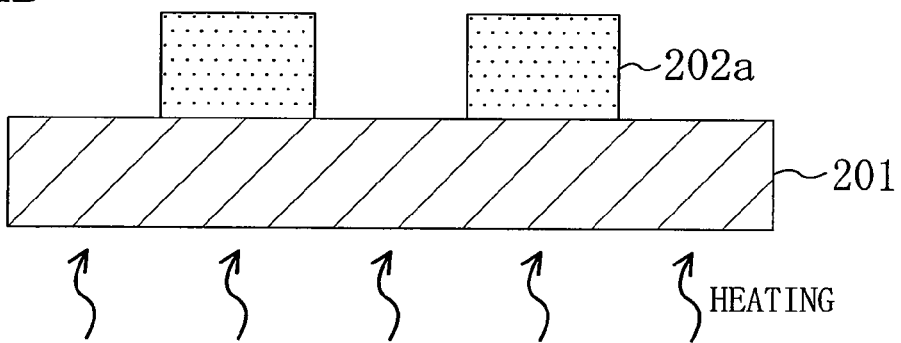

Thermal acid generator: toluenesulfonic acid—(2-isopropyl-5-methyl-cyclohexyl) . . . 2 g Solvent: isoamyl alcohol . . . 25 g Thereafter, as shown in FIG. 4B, the solution 205 is removed, and then the first resist pattern 202a is heated at a temperature of 100° C. for 60 seconds.

Figure 4C:
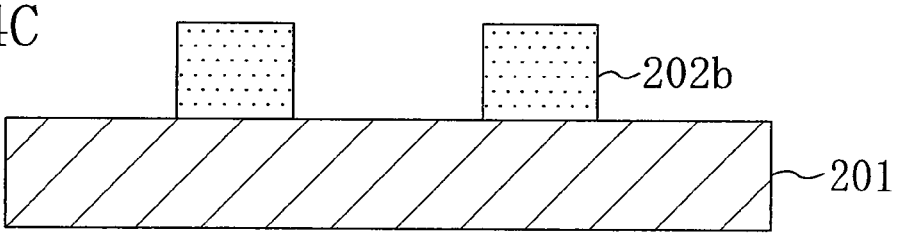

Then, the first resist pattern 202a is developed with a 2.38 wt % tetramethylammonium hydroxide developer, thereby obtaining a second resist pattern 202b trimmed to have a line width of 45 nm and maintaining a desired shape of the first resist pattern 202a, as shown in FIG. 4C.

In this manner, in the second embodiment, the first resist pattern 202a is exposed to the solution 205 containing toluenesulfonic acid—(2-isopropyl-5-methyl-cyclohexyl) as the thermal acid generator, and then is heated again at a temperature lower than that at post exposure bake. At this time, the thermal acid generator diffused in the surface of the first resist pattern 202a generates acid by heating, and causes acid elimination of acid leaving groups of main polymer (i.e., base polymer) located in the surface of the first resist pattern 202a. Accordingly, a subsequent phenomenon causes the surface of the first resist pattern 202a to be uniformly dissolved, thereby uniformly trimming the pattern. As a result, the second resist pattern 202b has a desired shape.

THIRD EMBODIMENT

A pattern forming method according to a third embodiment will be described hereinafter with reference to FIGS. 5A-5D and 6A-6C.

First, a chemically amplified positive resist material having the following composition is prepared.

Figure 5A:
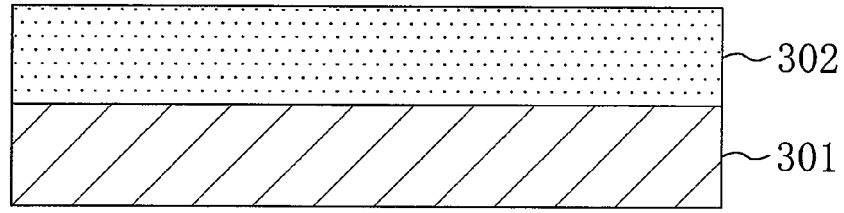
FIGS. 5A-5D are cross-sectional views illustrating process steps of a pattern forming method according to a third embodiment.
Figure 5B:
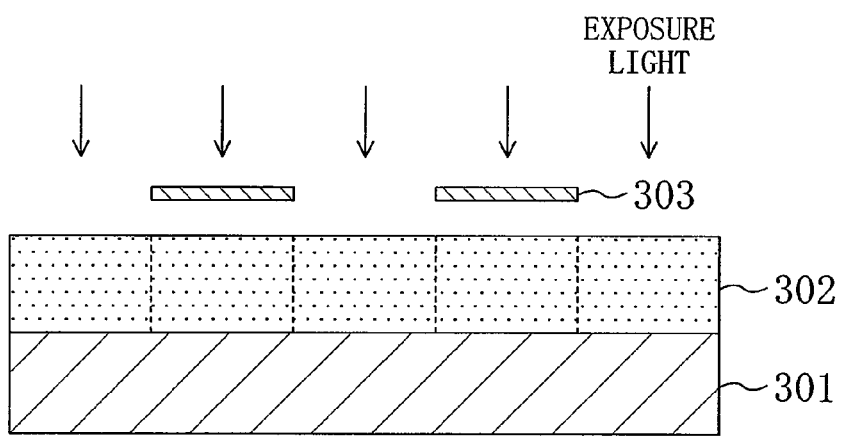

Base polymer: poly(2-methyl-2-adamanthyl methacrylate (50 mol %)—γ-butyrolactone methacrylate (40 mol %)—2-hydroxy adamantane methacrylate (10 mol %)) . . . 2 g Photoacid generator: triphenylsulfonium nonafluorobutanesulfonic acid . . . 0.05 g Quencher: triethanolamine . . . 0.002 g Solvent: propylene glycol monomethyl ether acetate . . . 20 g Next, as shown in FIG. 5A, the chemically amplified resist material is applied on a substrate 301, and then is heated at a temperature of 90° C. for 60 seconds, thereby forming a resist film 302 with a thickness of 120 nm. Then, as shown in FIG. 5B, the resist film 302 is irradiated with exposure light which is ArF excimer laser light having an NA of 0.93 through a mask 303, thereby performing pattern exposure.

Figure 5C:
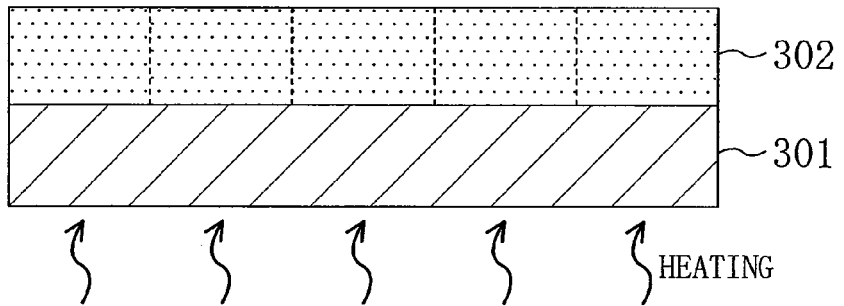

After the pattern exposure, as shown in FIG. 5C, the resist film 302 is heated with a hot plate at a temperature of 110° C. for 60 seconds.

Figure 5D:
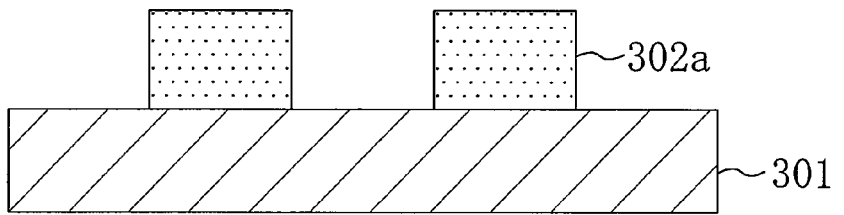

Thereafter, as shown in FIG. 5D, the resist film 302 is developed with a 2.38 wt % tetramethylammonium hydroxide developer, thereby obtaining a first resist pattern 302a made of an unexposed portion of the resist film 302 and having a line width of 60 nm.

Figure 6A:
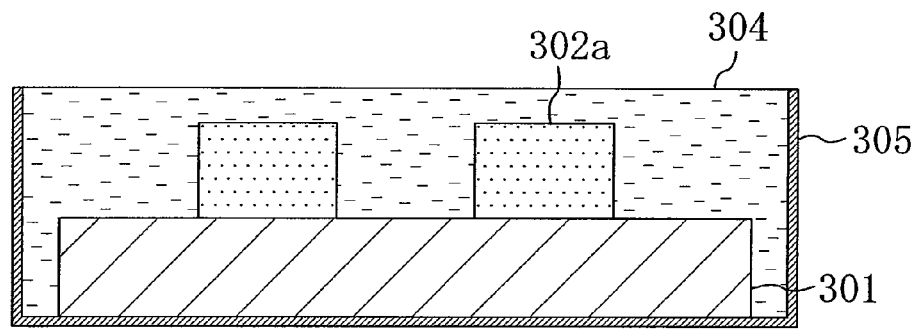
FIGS. 6A-6C are cross-sectional views illustrating process steps of the pattern forming method of the third embodiment.

Subsequently, as shown in FIG. 6A, the substrate 301 having the first resist pattern 302a is immersed for 40 seconds in a vessel 305 filled with a solution 304 containing a thermal acid generator having a composition below, thereby exposing the first resist pattern 302a to the solution 304.

Thermal acid generator: toluenesulfonic acid cyclohexyl . . . 5 g

Solvent: sec-butyl alcohol . . . 25 g

Figure 6B:
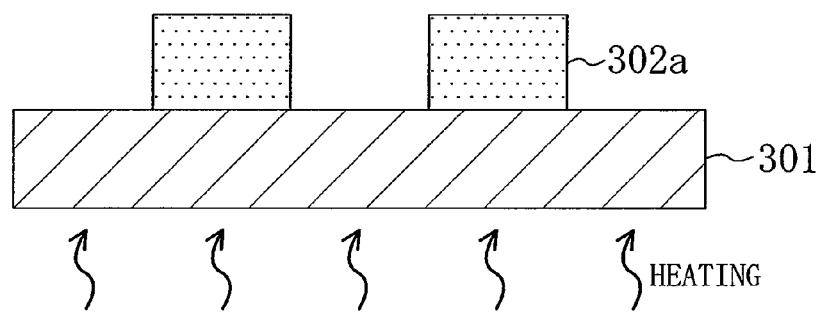

Thereafter, as shown in FIG. 6B, the substrate 301 is taken out from the solution 304, and then the first resist pattern 302a is heated at a temperature of 95° C. for 60 seconds.

Figure 6C:
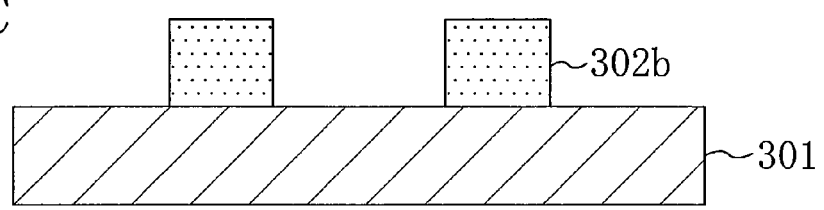

Then, the first resist pattern 302a is developed with a 2.38 wt % tetramethylammonium hydroxide developer, thereby obtaining a second resist pattern 302b trimmed to have a line width of 50 nm and maintaining a desired shape of the first resist pattern 302a, as shown in FIG. 6C.

In this manner, in the third embodiment, the first resist pattern 302a is exposed to the solution 304 containing toluenesulfonic acid cyclohexyl as the thermal acid generator, and then is heated again at a temperature lower than that at post exposure bake. At this time, the thermal acid generator diffused in the surface of the first resist pattern 302a generates acid by heating, and causes acid elimination of acid leaving groups of main polymer (i.e., base polymer) located in the surface of the first resist pattern 302a. Accordingly, a subsequent phenomenon causes the surface of the first resist pattern 302a to be uniformly dissolved, thereby uniformly trimming the pattern. As a result, the second resist pattern 302b has a desired shape.

FOURTH EMBODIMENT

A pattern forming method according to a fourth embodiment will be described hereinafter with reference to FIGS. 7A-7D and 8A-8C.

First, a chemically amplified positive resist material having the following composition is prepared.

Figure 7A:
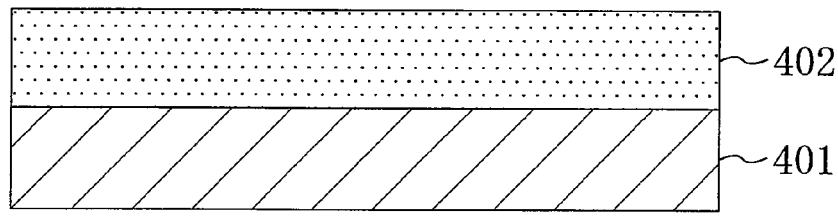
FIGS. 7A-7D are cross-sectional views illustrating process steps of a pattern forming method according to a fourth embodiment.

Base polymer: poly(2-methyl-2-adamanthyl methacrylate (50 mol %)—γ-butyrolactone methacrylate (40 mol %)—2-hydroxy adamantane methacrylate (10 mol %)) . . . 2 g Photoacid generator: triphenylsulfonium nonafluorobutanesulfonic acid . . . 0.05 g Quencher: triethanolamine . . . 0.002 g Solvent: propylene glycol monomethyl ether acetate . . . 20 g Next, as shown in FIG. 7A, the chemically amplified resist material is applied on a substrate 401, and then is heated at a temperature of 90° C. for 60 seconds, thereby forming a resist film 402 with a thickness of 120 nm.

Figure 7B:
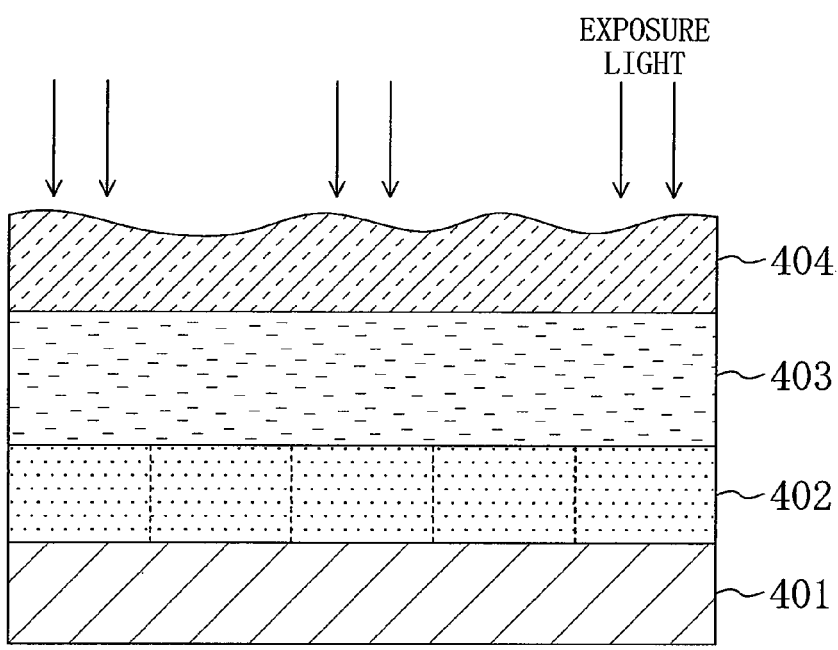

Then, as shown in FIG. 7B, with water 403 for immersion lithography provided between the resist film 402 and a projection lens 404 by, for example, a puddle method, the resist film 402 is irradiated, through the water 403, with exposure light which is ArF excimer laser light having an NA of 1.2 through a mask (not shown), thereby performing pattern exposure.

Figure 7C:
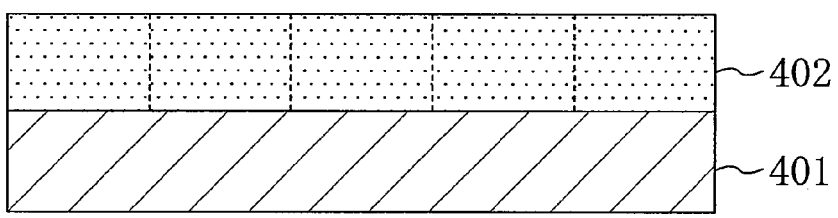

After the pattern exposure, as shown in FIG. 7C, the resist film 402 is heated with a hot plate at a temperature of 110° C. for 60 seconds.

Figure 7D:
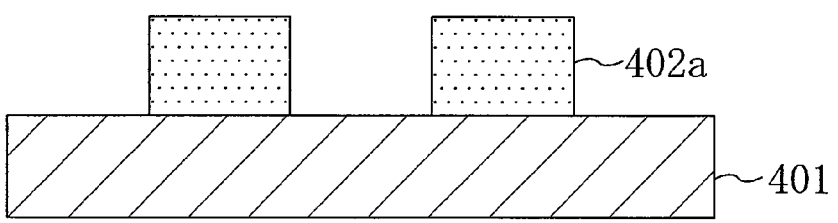

Thereafter, as shown in FIG. 7D, the resist film 402 is developed with a 2.38 wt % tetramethylammonium hydroxide developer, thereby forming a first resist pattern 402a made of an unexposed portion of the resist film 402 and having a line width of 55 nm.

Figure 8A:
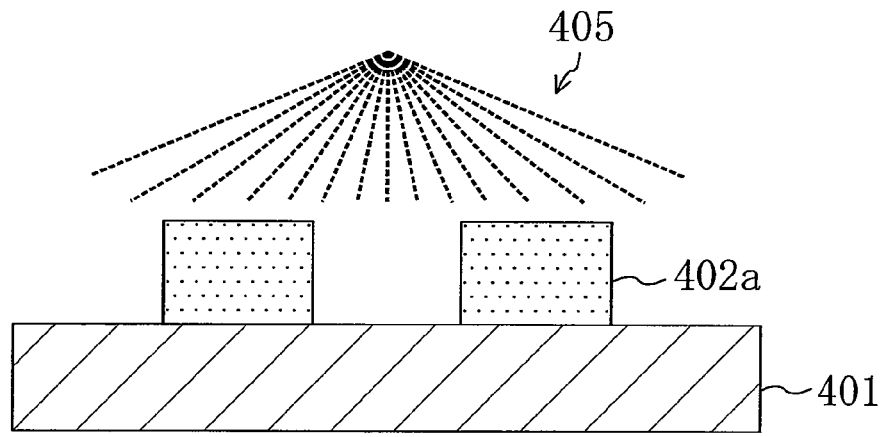
FIGS. 8A-8C are cross-sectional views illustrating process steps of the pattern forming method of the fourth embodiment.

Subsequently, as shown in FIG. 8A, a solution 405 containing a thermal acid generator having a composition below is sprayed onto the first resist pattern 402a on the substrate 401, thereby exposing the first resist pattern 402a to the solution 405 for 90 seconds.

Figure 8B:
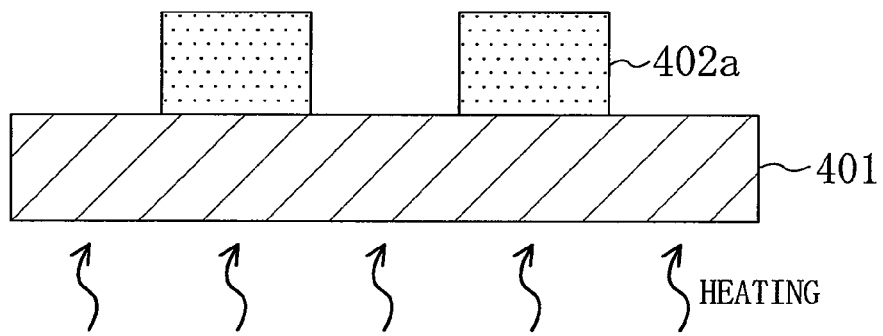

Thermal acid generator: toluenesulfonic acid—(2-isopropyl-5-methyl-cyclohexyl) . . . 2 g Solvent: isoamyl alcohol . . . 25 g Thereafter, as shown in FIG. 8B, the solution 405 is removed, and then the first resist pattern 402a is heated at a temperature of 100° C. for 60 seconds.

Figure 8C:
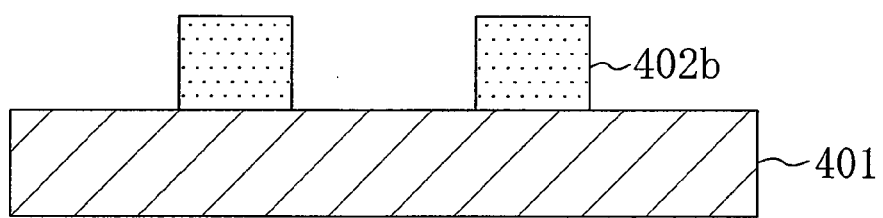
Figure 9A:
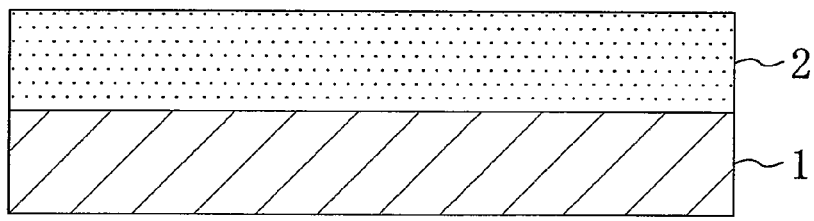
FIGS. 9A-9D are cross-sectional views illustrating process steps of a conventional pattern forming method.
Figure 9B:
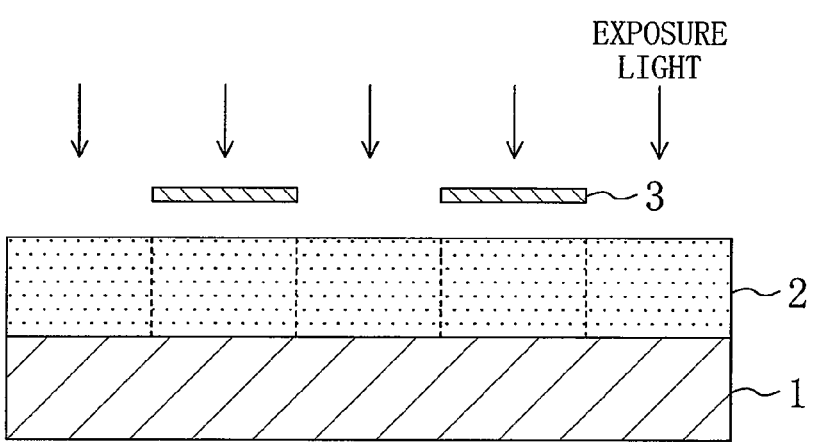
Figure 9C:
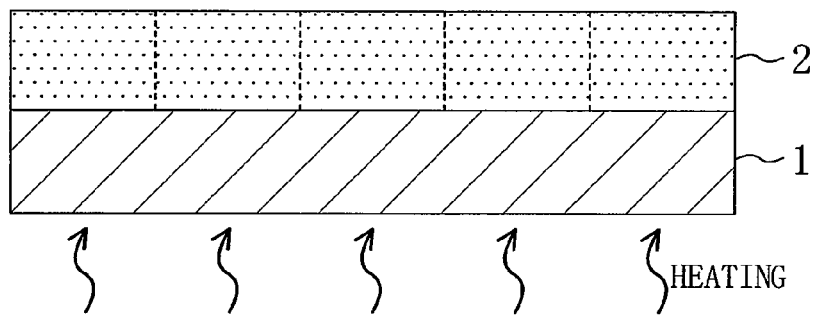
Figure 9D:
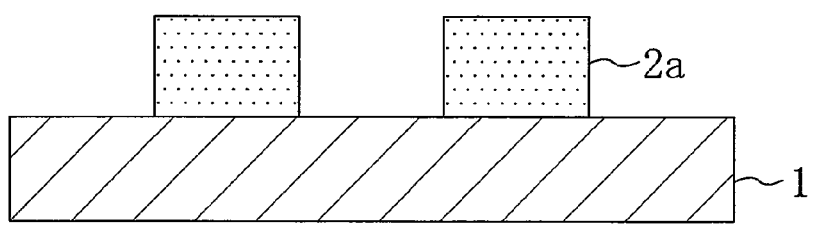
Figure 10A:
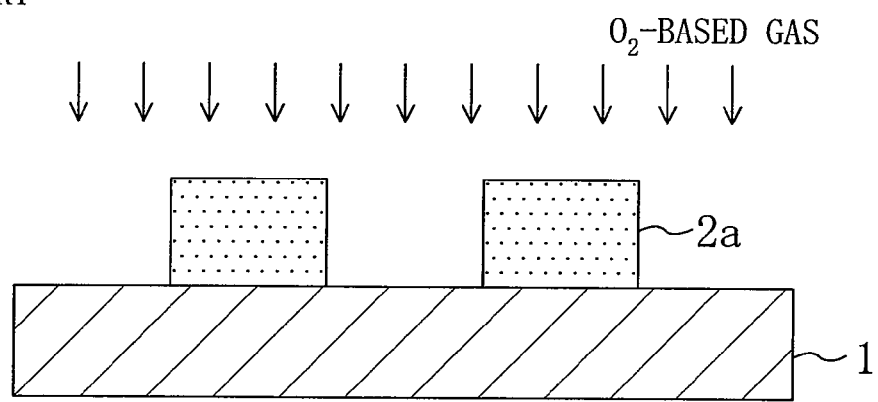
FIGS. 10A and 10B are cross-sectional views illustrating process steps of the conventional pattern forming method.
Figure 10B:
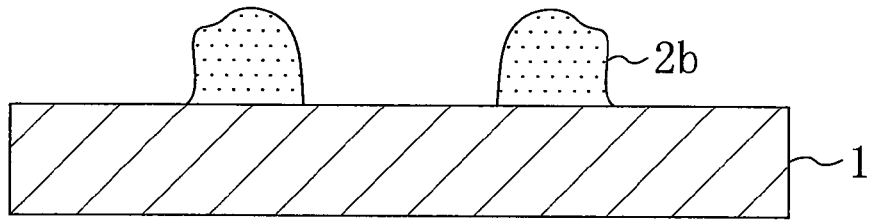

Then, the first resist pattern 402a is developed with a 2.38 wt % tetramethylammonium hydroxide developer, thereby obtaining a second resist pattern 402b trimmed to have a line width of 45 nm and maintaining a desired shape of the first resist pattern 402a, as shown in FIG. 8C.

In this manner, in the fourth embodiment, the first resist pattern 402a is exposed to the solution 405 containing toluenesulfonic acid—(2-isopropyl-5-methyl-cyclohexyl) as the thermal acid generator, and then is heated again at a temperature lower than that at post exposure bake. At this time, the thermal acid generator diffused in the surface of the first resist pattern 402a generates acid by heating, and causes acid elimination of acid leaving groups of main polymer (i.e., base polymer) located in the surface of the first resist pattern 402a. Accordingly, a subsequent phenomenon causes the surface of the first resist pattern 402a to be uniformly dissolved, thereby uniformly trimming the pattern. As a result, the second resist pattern 402b has a desired shape.

In the first through fourth embodiments, the photoacid generator forming the chemically amplified resist material contains triphenylsulfonium trifluoromethanesulfonic acid and triphenylsulfonium nonafluorobutanesulfonic acid. Alternatively, in these embodiments, at least one of those materials including diphenyliodonium trifluoromethanesulfonic acid and diphenyliodonium nonafluorobutanesulfonic acid may be used.

As the thermal acid generator for trimming, toluenesulfonic acid cyclohexyl is used in the first and third embodiments, and toluenesulfonic acid—(2-isopropyl-5-methyl-cyclohexyl) is used in the second and fourth embodiments. Alternatively, toluenesulfonic acid—(2-isopropyl-5-methyl-cyclohexyl) may be used in the first and third embodiments, and toluenesulfonic acid cyclohexyl may be used in the second and fourth embodiments.

In the first through fourth embodiments, sec-butyl alcohol and isoamyl alcohol are used as the solvent in which the thermal acid generator is to be dissolved. However, the present invention is not limited to these materials. Alternatively, n-propyl alcohol, isopropyl alcohol, n-butyl alcohol, isobutyl alcohol, tert-butyl alcohol, n-amyl alcohol, sec-amyl alcohol, or tert-amyl alcohol may be used, for example.

In the first through fourth embodiments, ArF excimer laser is used as exposure light for pattern exposure. Alternatively, KrF excimer laser light may also be used. Further, in the first and third embodiments using dry exposure techniques, in addition to KrF excimer laser light, extreme ultraviolet light or electron beams may also be used.

According to the present invention, a pattern forming method for forming a desired pattern shape with a trimming technique can be easily implemented. Thus, the present invention is useful for, for example, forming fine patterns in processes for fabricating semiconductor devices, for example.

What is claimed is:

1. A pattern forming method, comprising the steps of:
forming, on a substrate, a resist film of a positive type containing a photoacid generator;
performing pattern exposure by selectively irradiating the resist film with exposure light;
performing first heating on the resist film subjected to the pattern exposure;
performing first development on the resist film after the heating, thereby forming a first resist pattern out of the resist film;
exposing the first resist pattern to a solution containing a thermal acid generator and containing neither polymer nor a cross-linking agent;
performing second heating on the first resist pattern after the exposure to the solution; and
performing second development on the first resist pattern after the heating, thereby forming a second resist pattern made of the first resist pattern having a reduced size.

2. The pattern forming method of claim 1, wherein the exposure light is one of KrF excimer laser light, ArF excimer laser light, extreme ultraviolet light, and electron beams.

3. The pattern forming method of claim 1, wherein the step of performing the pattern exposure is performed with a liquid provided on the resist film.

4. The pattern forming method of claim 3, wherein the liquid is water.

5. The pattern forming method of claim 3, wherein the exposure light is one of KrF excimer laser light and ArF excimer laser light.

6. The pattern forming method of claim 3, wherein the thermal acid generator is decomposed by the second heating.

7. The pattern forming method of claim 3, wherein the photoacid generator is decomposed at a temperature higher than a temperature of the second heating.

8. The pattern forming method of claim 3, wherein the photoacid generator is at least one of triphenylsulfonium trifluoromethanesulfonic acid, triphenylsulfonium nonafluorobutanesulfonic acid, diphenyliodonium trifluoromethanesulfonic acid, and diphenyliodonium nonafluorobutanesulfonic acid.

9. The pattern forming method of claim 3, wherein the thermal acid generator is one of toluenesulfonic acid cyclohexyl and toluenesulfonic acid—(2-isopropyl-5-methyl-cyclohexyl).

10. The pattern forming method of claim 3, wherein the step of exposing the first resist pattern to the solution is performed with one of a puddle method, a dipping method, and a spray method.

11. The pattern forming method of claim 1, wherein the thermal acid generator is decomposed by the second heating.

12. The pattern forming method of claim 1, wherein the photoacid generator is decomposed at a temperature higher than a temperature of the second heating.

13. The pattern forming method of claim 1, wherein the photoacid generator is at least one of triphenylsulfonium trifluoromethanesulfonic acid, triphenylsulfonium nonafluorobutanesulfonic acid, diphenyliodonium trifluoromethanesulfonic acid, and diphenyliodonium nonafluorobutanesulfonic acid.

14. The pattern forming method of claim 1, wherein the thermal acid generator is one of toluenesulfonic acid cyclohexyl and toluenesulfonic acid—(2-isopropyl-5-methyl-cyclohexyl).

15. The pattern forming method of claim 1, wherein the step of exposing the first resist pattern to the solution is performed with one of a puddle method, a dipping method, and a spray method.

* * * * *